(12) United States Patent
Dautartas et al.

(10) Patent No.: US 6,265,240 B1
(45) Date of Patent: Jul. 24, 2001

(54) METHOD AND APPARATUS FOR PASSIVELY ALIGNING COMPONENTS ON SEMICONDUCTOR DIES

(75) Inventors: Mindaugas F. Dautartas, Alburtis; James F. Dormer, Limekiln; John W. Osenbach, Kutztown; Edward A. Pitman, Grantville, all of PA (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 09/047,014

(22) Filed: Mar. 24, 1998

(51) Int. Cl.[7] .................................................. H01L 21/00
(52) U.S. Cl. .............................................. 438/55; 438/51
(58) Field of Search .................................. 438/25, 26, 64, 438/51, 55

(56) References Cited

U.S. PATENT DOCUMENTS

| | | | |
|---|---|---|---|
| 4,945,400 | * | 7/1990 | Blonder et al. . |
| 5,483,095 | * | 1/1996 | Kagawa et al. . |
| 5,499,732 | * | 3/1996 | Nishimoto . |
| 5,550,088 | * | 8/1996 | Dautartas et al. . |
| 5,854,087 | * | 12/1998 | Kurata . |

OTHER PUBLICATIONS

Kato et al., A New Assembly Architecture for Multichannel Single Mode–Fiber–Pigtail LD/PD Modules, pp. 89–94, Feb. 1, 1993.*

* cited by examiner

Primary Examiner—Charles Bowers
Assistant Examiner—Scott J. Hawranek
(74) Attorney, Agent, or Firm—Synnestvedt & Lechner LLP (57) ABSTRACT

A method and apparatus for passively aligning an optical element on an optical die wherein multiple potential mounting pads are supplied for potential mounting of the optical component. Appropriate tables are generated for 1) the response of the optical detecting component for a given light power level as a function of the mounting position of the optical detecting component, and 2) the asymmetry of the light generating component. Given the two tables an algorithm is prepared for automatically determining the appropriate mounting position to provide desired detection device response characteristics for any given light generating component to be mounted on the die.

16 Claims, 7 Drawing Sheets

METHOD AND APPARATUS FOR PASSIVELY ALIGNING COMPONENTS ON SEMICONDUCTOR DIES

FIELD OF THE INVENTION

The invention pertains to optical bench dies. More particularly, the invention pertains to a method and apparatus for passively aligning a photodetector on the optical bench during fabrication.

BACKGROUND OF THE INVENTION

In the fiber optics field, the term optical bench is commonly used to denote a semiconductor die design particularly adapted for opto-electronic applications. More particularly, an optical bench die is a die having a design which, depending on the components mounted thereon, can serve as the basis for several different optical or opto-electronic applications. For instance, an optical bench die with a laser mounted thereon can be used as an optical transmitter. The same die having no laser mounted thereon, but rather a photodetector, can be used as an optical receiver. One such optical bench die is the silicon optical bench (SiOB) die used as a basic building block in the Laser 2000 series of chips manufactured by Lucent Technologies, Inc. of Murray Hill, N.J. This SiOB die is particularly designed for opto-electronic telecommunication applications, such as in fiber optic telephone networks.

When an optical bench die is used as the basis of a transmitting component, a semiconductor laser diode typically will be mounted on the surface of the die. The current input terminal or terminals of the laser diode are coupled to a signal source. In essence, a semiconductor laser diode converts current into light with the instantaneous light output power level being proportional to the instantaneous value of the current.

In the gain region of the semiconductor laser, current is converted into light and the light is amplified. A portion of the light is allowed to escape through an output facet that is partially reflective and partially transparent. The light which escapes through the facet is the output light of the laser.

For various reasons, it is often desirable to monitor the amount of light generated by the laser responsive to the current applied at the input(s) of the laser. One of the more prevalent reasons for this is the fact that the ratio of the light power generated relative to the applied input current (hereinafter the laser's current-to-light ratio) typically degrades over time. Accordingly, in order to maintain light output levels within required tolerances, it is common to monitor the current-to-light ratio and, through feedback, adjust the input current to the laser in order to maintain light output power within specified tolerances.

One known way to monitor the output light power of the laser diode is to include another partially transparent facet on the rear of the laser and to place a photodetector diode in a position to receive the light output from the rear facet of the laser. As long as the ratio of the amount of light escaping from the rear facet to the amount of light escaping from the front facet (i.e., the relative reflectivities of the front and rear facets) is known, then the amount of light output from the front facet is known by monitoring the light output from the rear facet. The ratio of the reflectivity of the front and rear facets is known as a laser's asymmetry.

The photodetector converts the received light into current. A feedback loop adjusts the current input signal amplification level into the laser as a function of the photodetector output current relative to the input signal current to the laser.

Laser asymmetry can vary widely from device to device under present fabrication technology. For instance, it would not be uncommon for the asymmetry of lasers fabricated in accordance with state of the art technology to vary from ratios of 1:2 to 1:20 from device to device for the same device design fabricated by the same fabrication process in the same fabrication line. In theory, the wide variation in asymmetries is not problematic as long as the asymmetry of the particular device is known and the feedback loop gain is adjusted accordingly. However, in practice, due to power restrictions in devices built using these optical benches, it is highly desirable or even necessary to restrict the current output of the photodetector diodes within very narrow tolerances.

Since, with all other factors remaining the same, wide variations in laser asymmetry will lead to wide variations in photodetector output currents, chip manufacturers have employed various means to restrict photodetector output currents within narrow tolerances. For example, one common technology is active alignment of a photodetector's mounting position relative to the laser position on a die to cause the photodetector's detection face to receive a specified portion of the rear facet output light in order to compensate for laser asymmetry variations. The term active alignment refers to a procedure for aligning the photodetector on the die by powering the laser and photodetector and actively measuring the laser light output power to photodetector current ratio (hereinafter the laser power to photodetector current ratio) as different alignments are tried. When the desired ratio is reached, the photodetector can be bonded to the die in the position that yielded the proper ratio.

While generally yielding accurate placement of photodetectors, active alignment is considerably more time consuming and expensive than passive alignment. The term passive alignment refers to alignment of components for mounting on a die surface based on fiduciary marks on the die. In passive alignment, an automated, robotic machine simply optically locates the fiduciary marks and mounts the given component at a position relative to the mark that is dictated by its programming.

Passive alignment techniques known in the prior art are sometimes unacceptable for placement of a photodetector in view of the problems mentioned above. This is because, in theory, each diode will need to be placed in a different position in order to properly set the laser power to photodetector current ratio.

Particularly, the photodetector can be actively aligned on the die surface so that its detection face receives only a specified portion of the light output by the laser. For instance, using a gold turning mirror and typical die, laser, and photodetector dimensions, optimal alignment of the photodetector will result in about 50% of the light emitted from the rear facet of the laser to reach the photodetector face. Accordingly, if the photodetector is being positioned on a SiOB die which bears a laser having a 1:20 asymmetry ratio, it may be positioned in the optimal position so as to receive 50% of the light output from the rear facet. In order to maintain photodetector output currents of all products within a narrow tolerance, when a photodetector is mounted on a SiOB die upon which a laser with a 1:2 asymmetry has been mounted, the photodetector is actively aligned so as to receive only 5% of the light output from the rear facet. Accordingly, the amount of current generated by the photodetector for a given front facet output light power of the laser is the same for both chips.

In an exemplary active alignment process, the laser diode is permanently mounted to the die surface. Then, the photodetector is temporarily positioned in a first position. The laser diode and the photodetector are then turned on and measurements are taken of the front facet output power of the laser and the corresponding current output of the photodetector to determine whether the photodetector output currents relative to the front facet output power of the laser are within specified tolerances. If not, the photodetector is moved to a new position and a new measurement is taken. The process is repeated until the photodetector output currents are within the specified tolerances. The photodetector is then permanently mounted in the position which yielded photodetector output currents within the specified tolerances. Many other laser/photodiode alignment systems are available which use variations of the active alignment process discussed herein.

The process of active alignment is difficult, expensive and time consuming.

Accordingly, it is an object of the present invention to provide an improved method and apparatus for aligning components for mounting on the surface of a semiconductor die.

It is another object of the present invention to provide an improved method and apparatus for passively aligning a photodetector diode on the surface of an optical bench die.

It is a further object of the present invention to provide an improved method and apparatus for aligning the position of a photodetector on the surface of an optical bench relative to a micro-machined cavity on the bench and a laser diode mounted on the bench.

It is yet one more object of the present invention to provide an improved semiconductor optical bench die adapted to accommodate easy passive alignment of components to be mounted thereon.

It is yet a further object of the present invention to provide an improved method and apparatus for setting the laser diode light output power level to photodetector diode current level ratio on a populated optical die.

SUMMARY OF THE INVENTION

The invention is a method and apparatus for passively aligning components for mounting on the surface of a semiconductor die. The invention is particularly suitable for passively aligning a laser monitoring photodetector diode relative to the turning mirror and the laser to be monitored.

In accordance with the invention, the asymmetry of each laser diode is measured and recorded. The optical bench die is designed with a plurality of mounting pads for the photodetector so as to provide multiple potential mounting positions for the photodetector. Further, a table or algorithm is generated for the particular SiOB die laser and photodiode design correlating photodetector mounting position (i.e., what mounting pad or pads the photodetector will be mounted upon) to laser asymmetry and the desired photodetector output current range relative to laser output power range.

Accordingly, an appropriate algorithm for operating the photodetector mounting apparatus can easily be written to mount a photodetector to the die surface as a function of the asymmetry of the laser mounted on the die. Particularly, the reflectivity of the turning mirror and the ratio of output current to received light power levels of the photodetector typically are highly accurate within very narrow tolerances (i.e., three sigma less than 5%). Accordingly, the asymmetry of the laser is the only variable which will have any significant impact on the laser power to photodetector current ratio.

DETAILED DESCRIPTION OF PREFERRED EMBODIMENTS OF THE INVENTION

Figure 1:
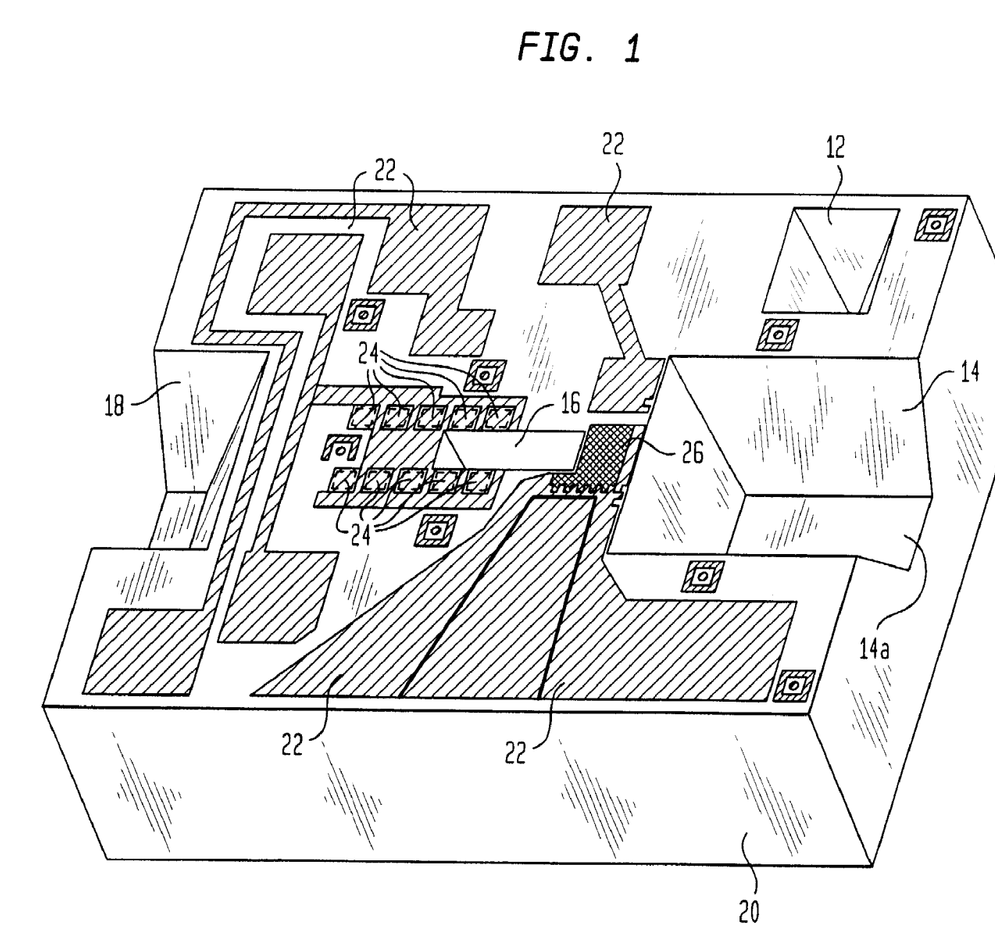
FIG. 1 is a perspective view of an exemplary optical bench semiconductor die in accordance with the present invention.

FIG. 1 is a generalized perspective view of the aforementioned SiOB die 10 used in the Laser 2000 series of products manufactured by Lucent Technologies, Inc., the assignee of the present invention. The die 10 includes four micro-machined cavities 12, 14, 16, and 18.

The die substrate 20 is silicon. The cross-hatched portions 22 on the surface are metallizations formed as surface conductors. Mounting pads 24 and 26 are provided for mounting components, such as laser diodes and photodetector diodes onto the surface of the die. Cavity 14 is positioned, sized and shaped to accept a micro-lens for focusing the light radiated from a laser diode mounted on pad 26. When the die 10 is packaged, the open end 14a of cavity 14 will be adjacent a light output port on the edge of the chip for coupling the light generated by the laser diode mounted on pad 26 to external circuitry.

Figure 2:
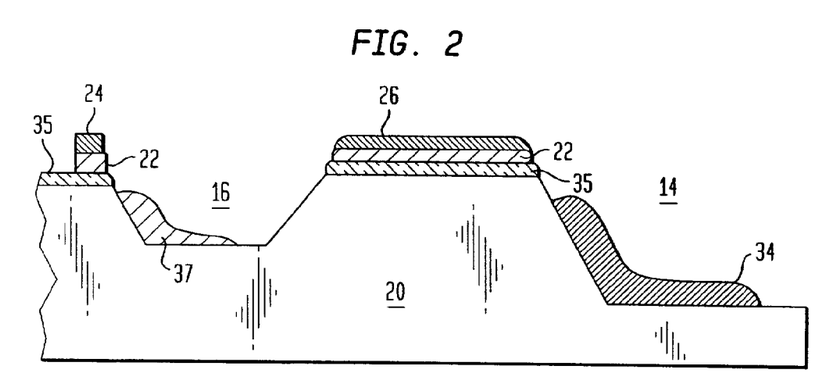
FIG. 2 is a cross-sectional view of the unpopulated die of FIG. 1 taken along line 2—2.

FIG. 2 is a cross-sectional view taken along lines 2—2 in FIG. 1. As shown, the SiOB die 10 is comprised of a silicon substrate 20. Cavity 14 is coated with an aluminum metallization layer 34. The aluminum layer 34 is placed in the cavity for purposes of bonding a micro-lens 44 in cavity 14 by aluminum oxide bonding. A 5000 angstrom thick layer of silicon dioxide ($SiO_2$) 35 is deposited on the top surface of the die between metallizations and the silicon to provide improved electrical isolation therebetween.

Surface conductor metallizations 22 are formed of a triple layer of titanium, platinum, and gold. The lower most layer is the titanium (Ti) layer. Titanium bonds very well to silicon dioxide and to platinum. Accordingly, it is the adhesive layer for the metallizations. The platinum (Pt) layer is bonded to the top of the titanium layer and acts as an insulator between the titanium and the gold. Particularly, titanium and gold will react with each other if placed in direct contact. Since gold (Au) is an excellent conductor, it is used as the top conductive layer for the contacts.

Cavity 16 also is coated with a metallization 25 of titanium, platinum, and gold layers for purposes of forming a turning mirror. Particularly, in thicknesses of greater than 500 angstroms, gold has over 90% reflectivity for light of wavelength greater than 1.0 microns.

Figure 3:
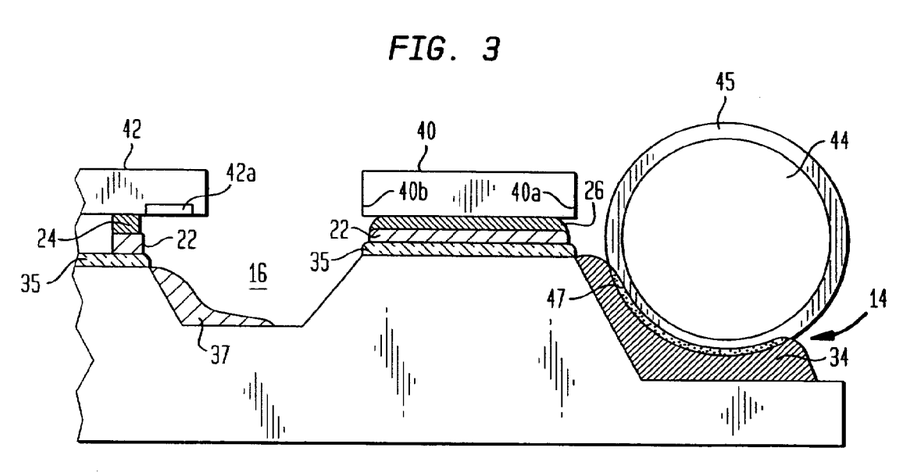
FIG. 3 is a cross-sectional view of the die of FIGS. 1 and 2 after it has been populated with optical components.

FIG. 3 is a cross-sectional view similar to that of FIG. 2, except showing the die populated with optical components. In this particular embodiment, the die will be embodied in a system configured as an optical transmitter. Lens 44 is bonded within cavity 14 by aluminum oxide bonding. In particular, the lens 44 is coated with a layer of silicon dioxide ($SiO_2$) which will bond strongly with the aluminum layer 45 when brought into contact therewith under heat and pressure. A laser diode 40 is mounted on mounting pad 26 via a bonding layer of Au/Sn (gold/tin). A photodetector diode 42 is mounted on the four pads 24 (best shown in FIG. 1) corresponding generally to the four corners of the photodetector diode package.

Laser diode 40 has a front output facet 40a and a rear output facet 40b through which the laser light generated within the diode escapes. Front facet 40a is the main light output facet and is used for the transmission of data. The rear output facet 40b emits a substantially attenuated amount of light relative to main light output facet 40a. Specifically, the reflectivity of the rear output facet is designed to be much higher than the reflectivity of the front output facet, thereby allowing a much smaller amount of light to escape. The light escaping from rear facet 40b, however, is directly proportional to the light escaping from front facet 40a. The ratio of the light power escaping from the two output facets, 40a and 40b, is known as the asymmetry of the laser.

Due to variations in the fabrication process, the asymmetry of any given laser diode of a particular design having gone through the exact same fabrication process can differ by an order of magnitude. Particularly, the reflectivity ratio of the front and rear output facets typically can range as much as from 2 to 20 for a given design for some fabrication processes. Since the amount of light escaping is a logarithmic function of the reflectivity of the output facets, the ratio of the light power emitted from the front and rear facets can differ by several orders of magnitude.

The rear output facet 40b of the laser diode 40 is used for monitoring purposes. Specifically, since the ratio of the input current to a laser diode to the amount of light produced by the laser diode can drift over time (months to years), it is desirable to monitor the light output power of the laser relative to the input current. A photodetector diode 42 is positioned to receive a portion of the light emitted from rear facet 40b of laser diode 40. The monitored light level can then be used in a feedback loop to control the input current levels to the laser diode 40 to maintain constant light output levels as the laser diode ages.

In particular, photodetector diode 42 has a detection face 42a located on its bottom surface. In addition to the detection surface 42a, a small (less than 5%) of laser light can be detected from the edge of the photodiode 42b. The photodetector 42 is mounted on mounting pads 24 such that the detection face 42a is positioned over cavity 16. As previously noted, cavity 16 is coated with a highly reflective gold surface coating. A portion of the light emitted from rear light output facet 40b is reflected off of the gold coating in cavity 16 into the detection face 42a of photodetector 42. The amount of light received by photodetector 42 as a function of the output power from the front facet 40a of the laser 40 is dependent on many factors, including 1) the asymmetry of the laser 40, 2) the reflectivity of the turning mirror, and 3) the amount of the light output from rear facet 40b that actually reaches the turning mirror.

The amount of current generated by the photodetector is a function of all of the above as well as the light-to-current ratio (usually referred to as the responsivity) of the photodetector diode 42. The current output of the photodetector 42 is then used in a feedback loop to control the current input levels to the laser diode so as to maintain the light output power levels of the laser diode constant even though the current-to-light ratio of the laser may change over time.

After the chip has been completely populated, the feedback loop can be tuned to assure the desired ratio.

Figure 4A:
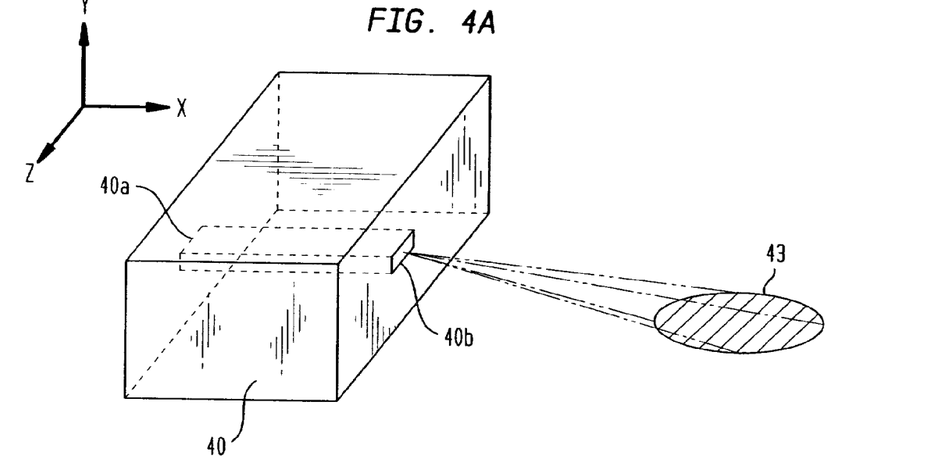
FIG. 4A is a perspective view of the rear light output facet of the laser diode of FIG. 3 illustrating the output pattern of light therefrom.
Figure 4B:
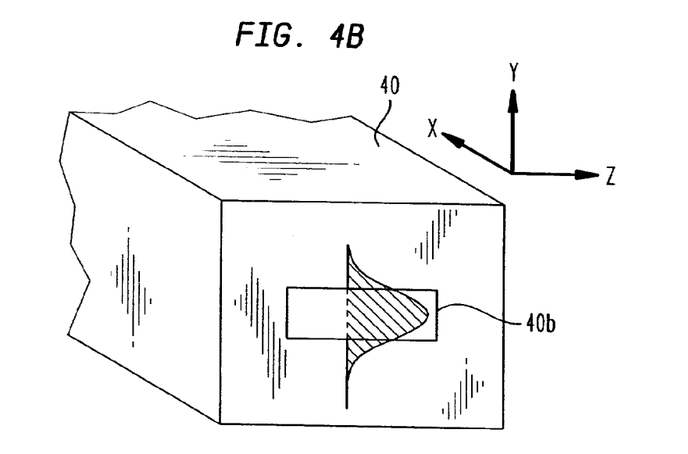
FIGS. 4B and 4C are graphs illustrating light output intensity spatial distribution perpendicular and parallel, respectively, to the long dimension of the active region of the laser from the rear light output facet of the laser diode of FIG. 3.
Figure 4C:
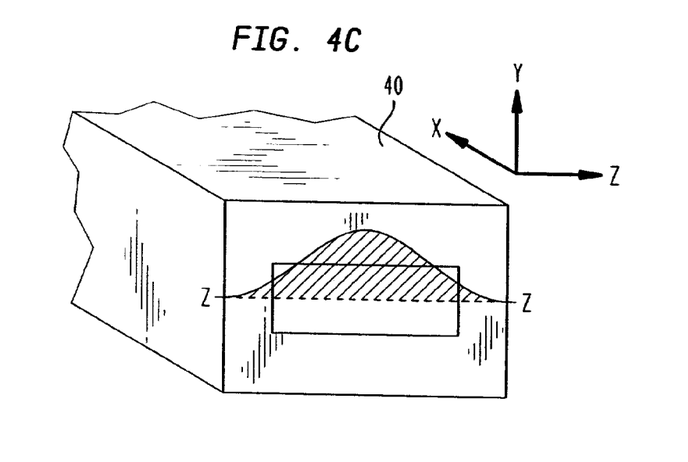

The position of the photodetector 42 relative to the cavity 16 and the laser diode 40 will have a significant impact on the amount of the light escaping from rear facet 40b that will make it into the detection face 42a of photodetector 42. Light escapes from facet 40b in a generally elliptical, conical shape 43 as shown in FIG. 4A. The light intensity is more concentrated at the center of the cone than at the edges. As shown in FIGS. 4B and 4C, the light intensity spatial distribution across the elliptical cross-section of the output facets of semiconductor diode lasers follows a bell curve pattern along both axes of the ellipse, with the highest light intensity at the center of the cone and the lowest at the perimeter. Accordingly, only a small fraction (typically less than 50%) of the light exiting from rear facet 40b of the laser 40 will enter cavity 16.

Figure 5A:
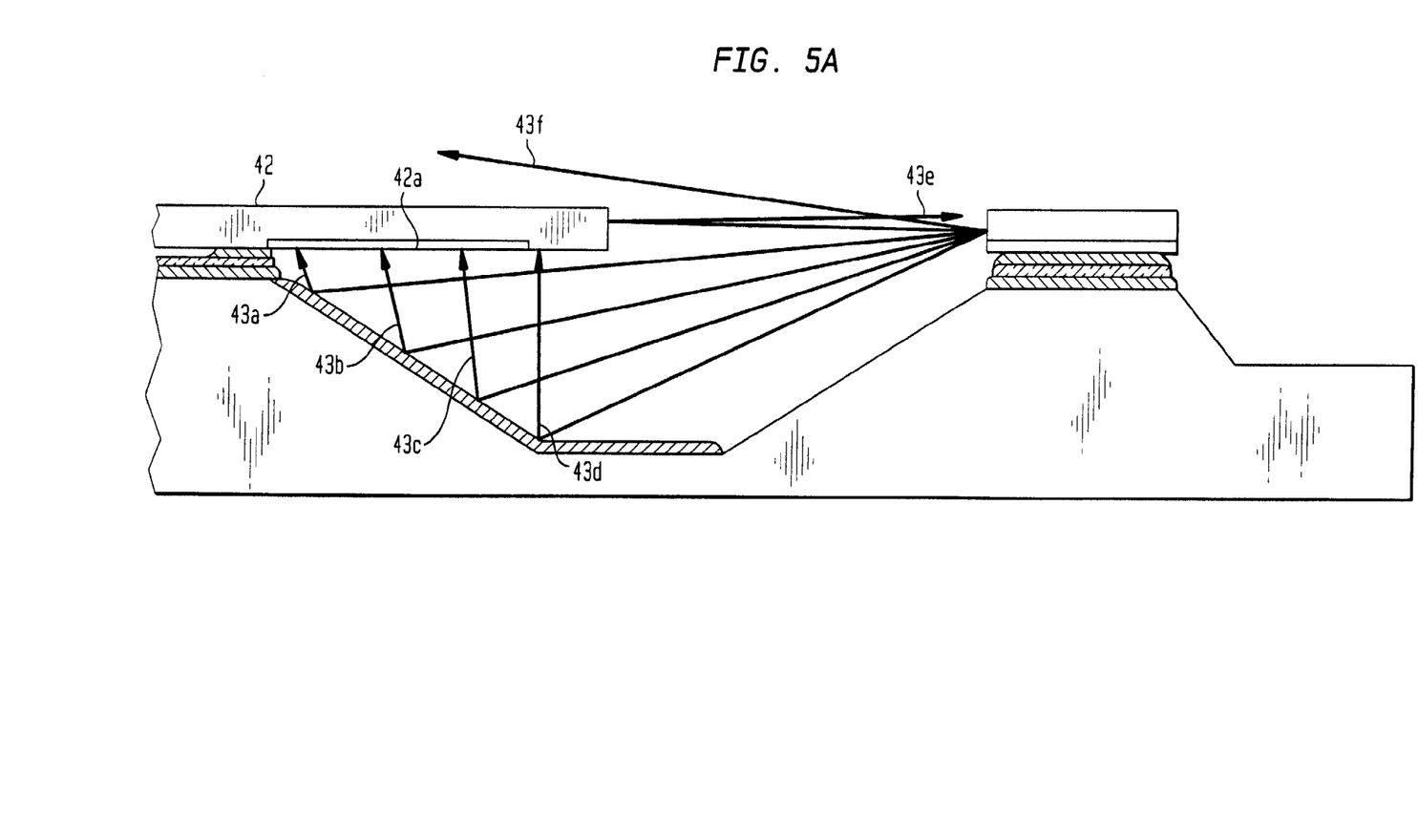
FIGS. 5A, 5B and 5C are cross-sectional side views of a portion of the populated die of FIG. 3 illustrating light detection distribution of the photodetector of FIG. 3 relative to different mounting positions of the photodetector on the die.
Figure 5B:
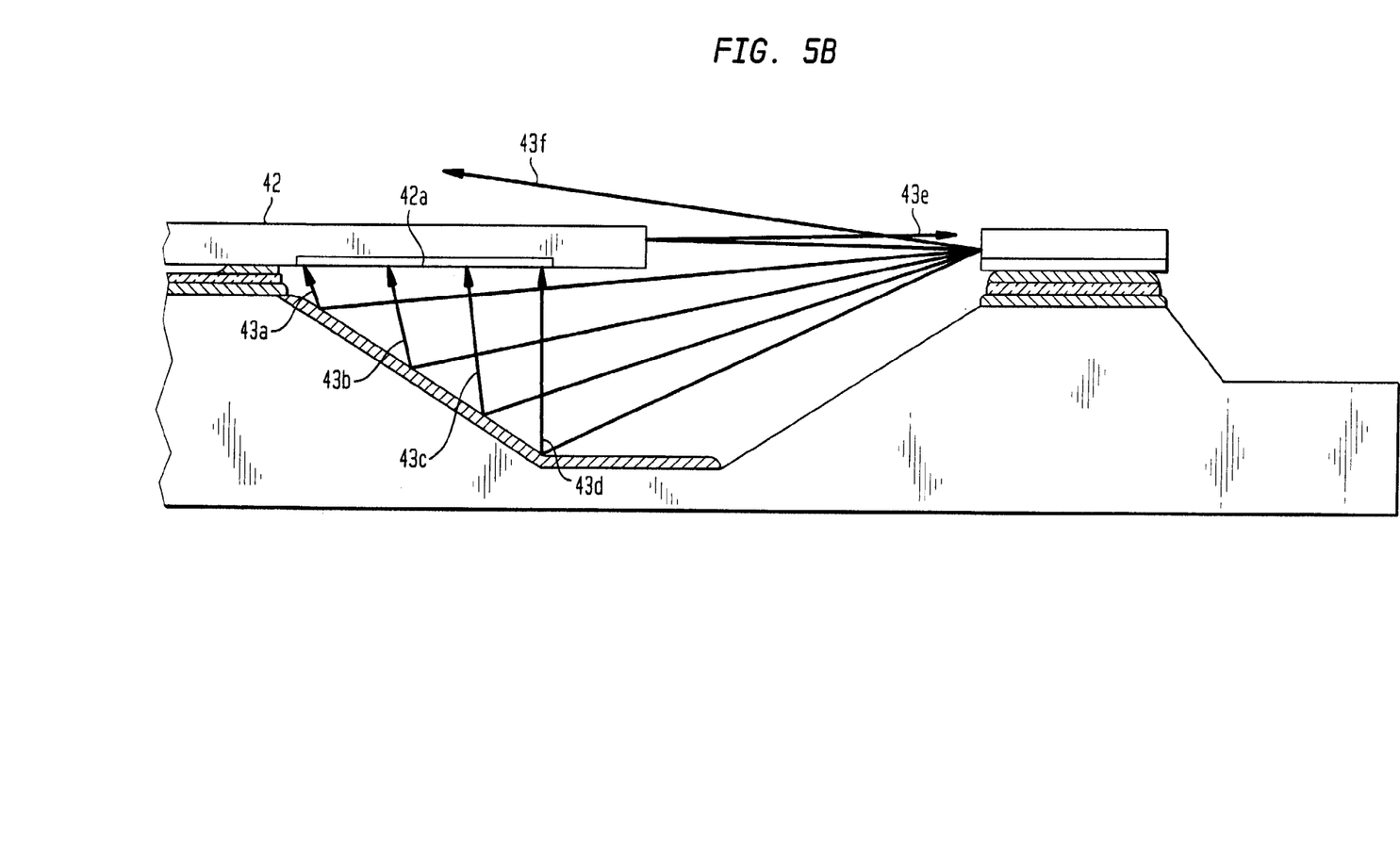
Figure 5C:
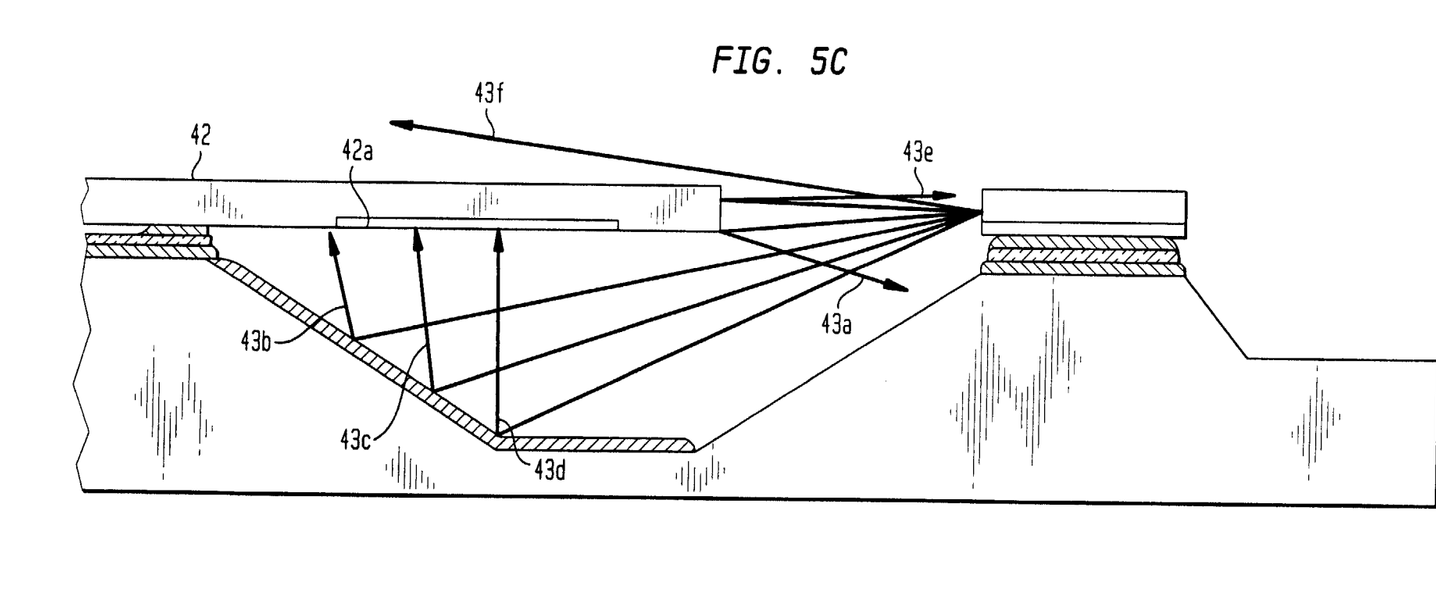

The position of the photodetector relative to the laser and the turning mirror cavity dictates both (1) how much of the light output from rear facet 40b enters turning mirror cavity 16 and (2) how much of that light is reflected into the photodetector face 42a. Thus, the amount of light detected by photodetector 42 is largely a function of its position relative to laser diode 40 and the turning mirror cavity. These effects are easily demonstrated by ray diagrams, such as illustrated by FIGS. 5A–5C. A ray diagram illustrates two dimensionally the elliptical light distribution pattern shown in perspective view in FIG. 4A with rays of light having an angular distribution that matches the elliptical light intensity spatial distribution.

For instance, in the position shown in FIG. 5A, part of the detection face is positioned over the planar top surface of the silicon die where light from the turning mirror cannot reach it. Only a portion of the light reflected from the turning mirror is reflected into the detector face 42a while some of the light reflected from the turning mirror, such as light ray 43d, is not reflected in the direction of the detection face. Thus, light ray 43d does not add to the detector current magnitude. However, in the position shown in FIG. 5B, photodetector face 42a will receive a larger portion of the light reflected off of the turning mirror, e.g., it will receive all of rays 43a–43d.

Further, as the front edge 52 of photodetector diode 42 is positioned even closer to the rear facet 40b of laser diode 40 as shown in FIG. 5C, the edge 52 of the photodetector diode will block more and more light from reaching cavity 16.

The present invention provides a method and apparatus by which the photodetector can be passively aligned for mounting in a position relative to the laser and the turning mirror cavity that will provide the desired laser power to photodetector current ratio, i.e., the ratio of (1) the laser power output from the front facet to (2) the current output of the photodetector monitoring light output from the rear facet of the laser. In accordance with the present invention and as best shown in FIG. 1, a plurality of mounting pads 24, e.g., ten, are provided for mounting of the photodetector diode 42 onto the die 10. The number and position of the mounting pads 24 should be selected to provide a plurality of potential mounting positions for the photodetector. Thus, in the illustrative embodiment discussed herein, in which the photodetector utilizes four mounting pads arranged in a square pattern for proper mounting, the ten mounting pads arranged in two lines of five each as shown in FIG. 1 provides three potential mounting positions for the photodetector. Particularly, the photodetector can be mounted using 1) pads 24a, 24b, 24e, and 24f, 2) pads 24c 24d, 24g, and 24h, or 3) pads 24e, 24f, 24i, and 24j.

The photodetector can be mounted on each die in a different one of the three above-discussed positions depending on the asymmetry of the laser diode. Normally, the asymmetry of the laser diodes would be known for each laser diode independent of the present invention. That is, after fabrication of laser diodes, they normally would be tested to determine many operating parameters, including their asymmetry, as a matter of standard post-fabrication testing. The laser power to photodetector current ratio is a function of many component characteristics, in addition to the aforementioned position of the photodetector relative to the laser and the turning mirror cavity. For example, this ratio also would be a function of, at least, 1) the reflectivity of the turning mirror, (2) laser asymmetry and (3) the current-to-light ratio of the photodetector. However, the asymmetry of the laser and the photodetector position are the only characteristics that would normally differ significantly from chip to chip. The current-to-light ratio of a photodetector fabricated in accordance with modern fabrication procedures is easily controlled within very tight tolerances. Further, the reflectivity of the turning mirror commonly is controllable within extremely tight tolerances in modern fabrication processes. Accordingly, selecting the photodetector mounting position as a function of only laser asymmetry typically will be sufficient for setting the laser power to photodetector current ratio for each chip.

Accordingly, given a specification for the laser power to photodetector current ratio, one can develop a table or algorithm dictating the appropriate mounting position for a photodetector as a function of the asymmetry of the laser. However, if desirable or necessary any other factor also can be added to the table or algorithm. For instance, the current to received light ratio of the photodetector can be factored into the table or algorithm. Particularly, like laser diodes, each photodetector typically will go through a testing procedure at the end of its fabrication to determine its operating characteristics, including output current to received light ratio. Thus, the photodetector's current-to-light ratio typically would already have been determined independent of the present invention. In accordance with the present invention, it would merely be a matter of factoring that parameter into the table or algorithm.

A control algorithm for the photodetector mounting apparatus can be easily written. The laser asymmetry and, if desired, photodetector current to light ratio for all devices can be stored with appropriate unique identification of each laser and photodetector in a database and sequentially run through the control algorithm in order to control the machine to mount each photodetector on each die in the appropriate one of the four possible positions.

With the present invention, the expense and time of active alignment is avoided. Rather, the present invention provides a method and apparatus for passive alignment of the photodetector so as to provide the desired laser power to photodetector current ratio for each die.

Figure 6:
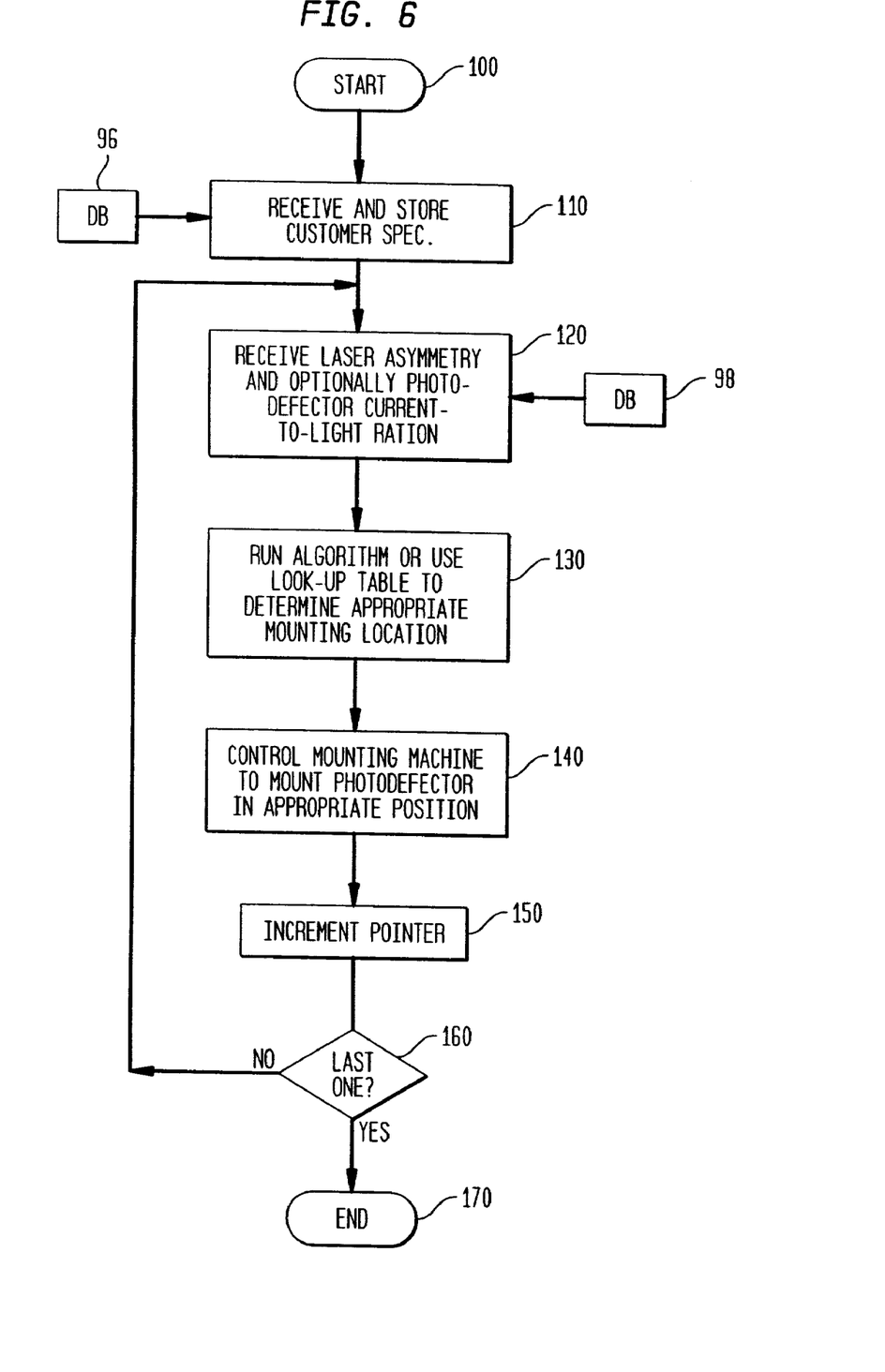
FIG. 6 is a flowchart illustrating one exemplary control routine for operating an apparatus for mounting photodetectors on dies in accordance with the present invention.

FIG. 6 shows an exemplary flow chart for operation of a mounting machine in accordance with the present invention. The process starts at step 100. In step 110, the information on laser asymmetry and, optionally, photodetector current to received light ratio, is received. In this exemplary embodiment, a pointer is used to address the database and the information is read from a database 98 individually for each photodetector/laser pair, i.e., for each die. However, alternately, the relevant information on a plurality of components may be read and stored in a buffer. An even further alternative is for a human operator to enter the data.

In step 130, the proper mounting location is determined based on the information obtained in steps 110 and 120. As shown in FIG. 6, the determination may be performed by a software algorithm which runs a calculation which has been prepared based on the customer's photodetector current output specifications. Alternately, the algorithm may utilize a look-up table which has been prepared based on the customer's photodetector current output specifications dictating a particular mounting position based on the combination of characteristics read in step 110.

In step 140, the mounting machine is controlled to mount the photodetector in the position determined in step 130.

In step 150, the database address pointer is incremented. In step 160, it is determined whether the last photodetector has been mounted. If not, processing flows back to repeat steps 110 through 150. When the last die has been populated with a photodetector, processing ends at step 170.

Although described above with respect to an embodiment in which the photodetector diode can be positioned in three potential positions arranged in a line, it should be clear that any number of potential mounting positions can be made available. Further, the photodetector position can be variable in any direction. For instance, pads for mounting the photodetector may also provide the option of mounting the photodetector in different positions in the direction in and out of the page in FIGS. 5A–5C. In fact, the plurality of potential mounting pads may be given different heights so that the photodetector height above the cavity also can be selectively set.

It also should be understood that the invention can be applied to correlate photodetector mounting position to any one or more parameters that might affect the laser power to photodetector current ratio. These include all of the aforementioned parameters as well as those not expressly mentioned herein. For example, depending on the fabrication process, the depth of the micro-machined turning mirror cavity may vary significantly from die to die. Thus, the turning mirror cavity depth may be measured for each die and the algorithm or table for determining the photodetector mounting position also may factor in this aspect of the chip.

Even further, in accordance with the present invention, the mounting position of the photodetector may be fixed and, instead, the mounting position of the laser diode relative to the photodetector and the turning mirror cavity can be varied as a function of laser asymmetry (or any other relevant parameter).

In accordance with the present invention, a photodetector can be passively aligned on the surface of a die with virtually no extra expense or time. Particularly, the photodetector mounting apparatus must be programmed in any event. The invention merely adds an extra algorithm or look up table routine to the mounting apparatus control software for determining proper mounting location. In fact, the algorithm or routine normally would be very simple since it only involves correlating only a very few variables to each other. Further, the laser asymmetry, photodetector current-to-light ratio, and/or turning mirror cavity depth are determined in any event independent of the present invention.

Having thus described a few particular embodiments of the invention, various alterations, modifications, and improvements will readily occur to those skilled in the art. Such alterations, modifications and improvements as are made obvious by this disclosure are intended to be part of this description though not expressly stated herein, and are intended to be within the spirit and scope of the invention. The foregoing description is by way of example only, and not limiting. The invention is limited only as defined in the following claims and equivalents thereto.

What is claimed:

1. A method for aligning, on a semiconductor die, a light detecting device for monitoring light output from a light producing device on said semiconductor die so as to cause an output signal of said light detecting device to be within a first specified range when said light producing device generates a light output power within a second specified range, said method comprising the steps of:

providing a plurality of potential mounting locations on said die for said light detecting device such that a portion of said light output by said light producing device that is detected by said light detecting device varies as a function of said mounting location;

generating data correlating mounting locations for light detecting devices to a characteristic of light producing devices;

applying said data to said light detecting device and said light producing device to determine a mounting location for said light detecting device relative to said light producing device that will cause said output signal of said light detecting device to be within said first specified range when said light producing device generates said light output power within said second specified range;

mounting said light producing device on said die; and mounting said light detecting device in a one of said potential mounting locations corresponding to said determined mounting location, whereby a portion of said light produced by said light producing device will be detected by said light detecting device.

2. A method as set forth in claim 1 wherein said light detecting device is a photodetector diode.

3. A method as set forth in claim 2 wherein said light producing device is a laser diode.

4. A method as set forth in claim 3 wherein said laser has first and second light output facets and said photodetector is positioned to detect light output from said second facet and wherein said characteristic of light producing device is its asymmetry.

5. A method as set forth in claim 4 wherein said generating step comprises generating a table correlating a plurality of laser asymmetry values to a plurality of mounting positions that will yield said specified light detecting device output range for said specified light producing device light output power range.

6. A method as set forth in claim 4 wherein said generating step comprises generating an algorithm correlating a plurality of laser asymmetry values to a plurality of mounting positions.

7. A method as set forth in claim 6 wherein said photodetector is mounted above a turning mirror cavity on said die and said photodetector is for detecting light emanating from said second facet of said laser and reflected from said turning mirror cavity.

8. A method as set forth in claim 7 wherein said generating step comprises:

generating data correlating mounting locations on said dies for said light detecting devices to a second characteristic of said die as well as said characteristic of said light producing device; and applying said data to a particular die and a particular light detecting device and particular light producing device to be mounted upon said die to determine a proper mounting location for said light detecting device.

9. A method as set forth in claim 8 wherein said second characteristic is a depth of said turning mirror cavity.

10. A method as set forth in claim 1 wherein said generating step comprises the steps of:

measuring said light output power of said light producing device;

determining a mounting position on said die for a light detecting device for a plurality of values of said output signal of said light producing device.

11. A method as set forth in claim 1 wherein said providing step comprises:

providing a plurality of potential mounting pads for said light detecting device such that said light detecting device can be mounted in various mounting positions on said die using a subset of said mounting pads.

12. A method for aligning, on a semiconductor die, a photodetector diode for monitoring and generating a current proportional to the power of light output from a rear facet of a laser diode mounted on said die so as to cause said current to be within a first range when a light output power from a front facet of said laser is within a second range, said method comprising the steps of:

providing a plurality of mounting pads for said photodetector to provide a plurality of potential mounting locations for said photodetector;

generating data correlating said mounting location to an asymmetry of said laser;

applying said data to said photodetector and said laser to determine a mounting location for said photodetector relative to said laser in order to provide said current in said first range corresponding to said light power being in said second range;

mounting said laser on said die; and mounting said photodetector using said mounting pads corresponding to said determined mounting location relative to said laser, whereby a portion of said light produced by said laser will be detected by said photodetector.

13. A method as set forth in claim 12 wherein said generating step comprises generating a table indicating mounting locations for yielding photodetector current outputs in said first specified range corresponding to laser front facet light output powers in said second specified range as a function of asymmetry values of said lasers.

14. A method as set forth in claim 12 wherein said generating step comprises utilizing an algorithm for calculating mounting locations for yielding photodetector current outputs in said first specified range corresponding to laser front facet light output powers in said second specified range as a function of an asymmetry value of said laser.

15. A method as set forth in claim 14 wherein said photodetector is mounted above a turning mirror cavity on said die and said photodetector is for detecting light emanating from said rear facet of said laser and reflected from said turning mirror cavity.

16. A method as set forth in claim 12 wherein said providing step comprises:

providing a plurality of potential mounting pads for said photodetector such that said photodetector can be mounted in various mounting positions on said die using a subset of said mounting pads.

* * * * *